(12) United States Patent
Furukawa et al.

(10) Patent No.: US 7,351,648 B2
(45) Date of Patent: Apr. 1, 2008

(54) METHODS FOR FORMING UNIFORM LITHOGRAPHIC FEATURES

(75) Inventors: Toshiharu Furukawa, Essex Junction, VT (US); Mark Charles Hakey, Fairfax, VT (US); Steven J. Holmes, Guilderland, NY (US); David V. Horak, Essex Junction, VT (US); Charles W. Koburger, III, Delmar, NY (US); Chung Hon Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 11/335,372

(22) Filed: Jan. 19, 2006

(65) Prior Publication Data

US 2007/0166981 A1    Jul. 19, 2007

(51) Int. Cl.
*H01L 21/44* (2006.01)
*H01L 21/76* (2006.01)

(52) U.S. Cl. .................. 438/597; 438/422; 438/614; 438/675; 257/E21.576

(58) Field of Classification Search ............... 438/422, 438/597, 614, 675; 257/E21.576
See application file for complete search history.

(56) References Cited

U.S. PATENT DOCUMENTS

| 6,838,355 | B1 * | 1/2005 | Stamper et al. | 438/409 |
| 6,972,443 | B2 * | 12/2005 | Khater | 257/197 |
| 7,012,007 | B1 * | 3/2006 | Goo et al. | 438/296 |
| 7,075,145 | B2 * | 7/2006 | Williams et al. | 257/329 |

\* cited by examiner

*Primary Examiner*—Scott B. Geyer
*Assistant Examiner*—Seahvosh Nikmanesh
(74) *Attorney, Agent, or Firm*—Keusey, Tutunjian & Bitetto, P.C.

(57) ABSTRACT

Methods for fabricating a semiconductor device include forming a first layer on an underlying layer, forming a hardmask on the first layer, and patterning holes through the hardmask and first layer. An overhang is formed extending over sides of the holes. A conformal layer is deposited over the overhang and in the holes until the conformal layer closes off the holes to form a void/seam in each hole. The void/seam in each hole is exposed by etching back a top surface. The void/seam in each hole is extended to the underlying layer.

20 Claims, 16 Drawing Sheets

METHODS FOR FORMING UNIFORM LITHOGRAPHIC FEATURES

BACKGROUND

1. Technical Field

The present invention relates to semiconductor processing and more particularly to a device and methods for forming lithographic and sub-lithographic features on or in a semiconductor device.

2. Description of the Related Art

Lithography is employed in many applications to pattern layers in semiconductor processing. One process where lithography is useful includes the process for producing contact holes. As dimensions shrink in semiconductor devices, forming contact holes becomes increasingly difficult. With current technology, reliably defining contact holes with reproducible size is a major hurdle for semiconductor manufacturing. Building very-reproducible sub-lithographically-dimensioned "holes" or trenches/troughs is needed.

Methods for producing small-dimension contact holes typically involve the use of optical lithography to print "larger" holes. These larger holes can then be shrunk to necessary (sub-lithographic) dimensions by depositing (and etching) spacers on the hole sidewalls. This process, however, produces holes with dimensional tolerances of at least the same magnitude as the original photo tolerance. For example, if a 100 nm hole is printed with ±10% tolerance, and the spacer process adds ZERO additional tolerance (which is virtually impossible), then adding 25 nm spacers will result in a hole of dimension 50 nm ±20%.

This increased percentage variability is often intolerable, and decreased tolerances are required.

Sidewall Image Transfer ("SIT") has been employed as a method for building sub-lithographic features. SIT offers opportunities to produce features with tolerance improved over that of the defining lithography. However, SIT is ideally suited for producing lines, not spaces or holes, and converting lines to holes is costly. Even if SIT troughs are made, making discrete round or square holes is not currently possible employing SIT, which naturally makes only continuous-loop shapes. Further, even if SIT could be employed, SIT would need an additional mask to cut resulting loop shapes into discrete features.

SUMMARY

Methods for fabricating a semiconductor device include forming a first layer on an underlying layer, forming a hardmask on the first layer, and patterning holes through the hardmask and first layer. An overhang is formed extending over sides of the holes. A conformal layer is deposited over the overhang and in the holes until the conformal layer closes off the holes to form a void/seam in each hole. The void/seam in each hole is exposed by etching back a top surface. The void/seam in each hole is then extended to the underlying layer.

Another method for fabricating a semiconductor device having uniform sized sub-lithographic features includes forming a first layer on an underlying layer, forming a hardmask on the first layer, patterning holes through the hardmask and first layer, and forming an overhang extending over sides of the holes by selectively depositing a material to form the overhang. A conformal layer is deposited over the overhang and in the holes until the conformal layer closes off the holes to form a void/seam in each hole. The void/seam is exposed in each hole by etching back a top surface, and the void/seam is extended in each hole to the underlying layer.

Another method for fabricating a semiconductor device having uniform sized sub-lithographic features includes forming a first layer on an underlying layer, patterning holes through the first layer, and forming spacers on sides of the holes. Selectively depositing a material on the first layer other than on the spacers forms an overhang over the holes using the selectively deposited material. The spacers are removed and a conformal layer is deposited over the overhang and in the holes until the conformal layer closes off a top of the holes to form a void/seam in each hole. The void/seam is exposed in each hole by etching back a top surface, and the void/seam is extended in each hole to the underlying layer.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFFERED EMBODIMENTS

Figure 1:
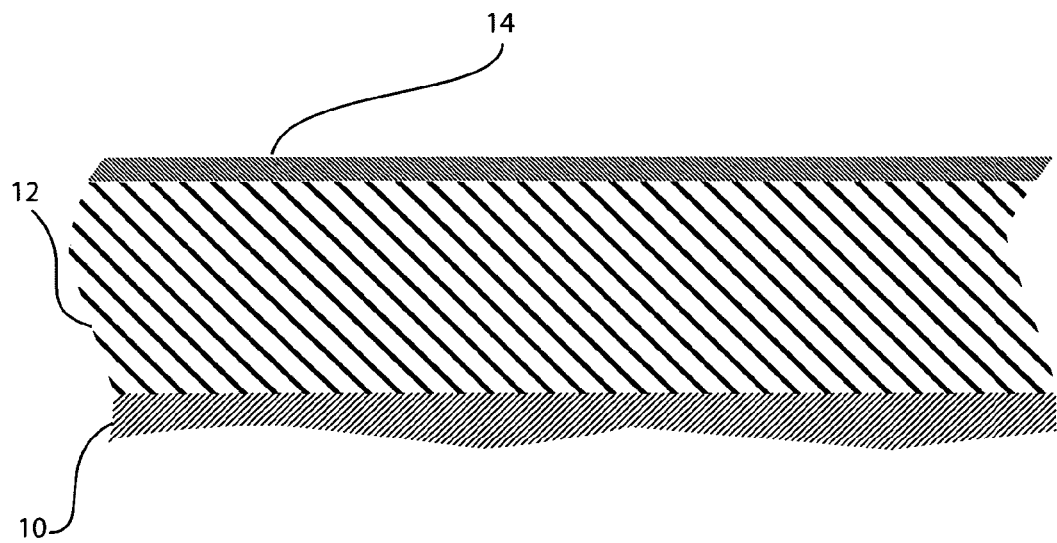
FIG. 1 is a cross-sectional view of a layer stack including an underlayer, a first layer of material on the underlayer and a hardmask.

Embodiments of the present invention provide methods for forming sub-lithographic features for solid-state devices, although methods of forming lithographic or larger features are also included. In particularly useful embodiments, methods for forming sub-lithographic contact holes are described. In one embodiment, a precisely-undercut hardmask is employed to produce structures with precisely-controlled seam-widths. These precision void/seam widths are substantially independent of the width of the original hole.

The undercut on the hardmask can be obtained by employing several methods. In one method, "straight" holes are formed through two layers of material employing conventional photolithography and etch, and then the lower material is etched ("laterally") under the top layer using a method which etches precise amounts independently of loading and spacing differences.

Another method also begins by etching "straight" holes, defined conventionally, through two layers of material. A precise thickness of material is then selectively deposited only on the upper material. This selectively-deposited material, as it forms on the sidewalls of the upper material, then creates an overhang.

In these cases, the methods are very repeatable, and provide a low-tolerance size of the overhang that determines the size of the final contact holes or features. The final features have a substantially same size despite the sizes of the holes formed initially which are subject to lithographic tolerances. Instead, the final features depend on the highly accurate deposited or laterally-etched overhang to size the features. Lateral etch tolerances of less than 4% have been demonstrated. In this way, improved tolerance and significant size uniformity among final features is achieved. This is particularly useful with sub-lithographic feature sizes.

Embodiments of the present invention may be useful as part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may used in the fabrication of integrated circuit chips or other integrated circuits where layers of material are employed. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. The integrated circuit chips may include memory chips, processors chips application specific chips or sets of chips.

In one embodiment, a very precise undercut is formed in an upper layer. After conventional formation of "starter holes" (using optical lithography and conventional reactive ion etching (RIE), for example), Chemical Oxide Removal ("COR") is preferably employed to produce an identical and precise undercut. This method shrinks the dimension between holes as an intermediate process step, which can lead to mechanical instability if not properly performed. If the shrinking dimension is a major difficulty, then the "as printed" starting holes size can be reduced employing some (conventional, and thus less-well-controlled) "spacer" deposition inside of the resist hole. The present invention will compensate for added tolerance until/unless the starter hole completely closes off during shrinkage.

Referring now to the drawings in which like numerals represent the same or similar elements and initially to FIG. 1, a substrate or underlying layer 10 may include silicon, silicon on insulator, gallium arsenide, germanium, an inter-level dielectric, conductors in a dielectric layer, or any other layer where vias, studs, plugs or contacts are to be connected to or placed within. A dielectric layer 12 is deposited or otherwise formed on layer 10. Layer 12 may include an oxide, such as a form of silicon oxide or any other dielectric layer. An upper layer 14 is formed over layer 12. Layer 14 may include a material, such as silicon nitride, and functions as a hardmask.

One aspect of the present invention is to make accurately-dimensioned contact holes in the top of layer 10 (an inter-level dielectric, for example). Deposited material 12 (e.g., 200-400 nm of oxide) and layer 14 (such as 25 nm $Si_3N_4$) are covered with a photoresist material 16.

Figure 2:
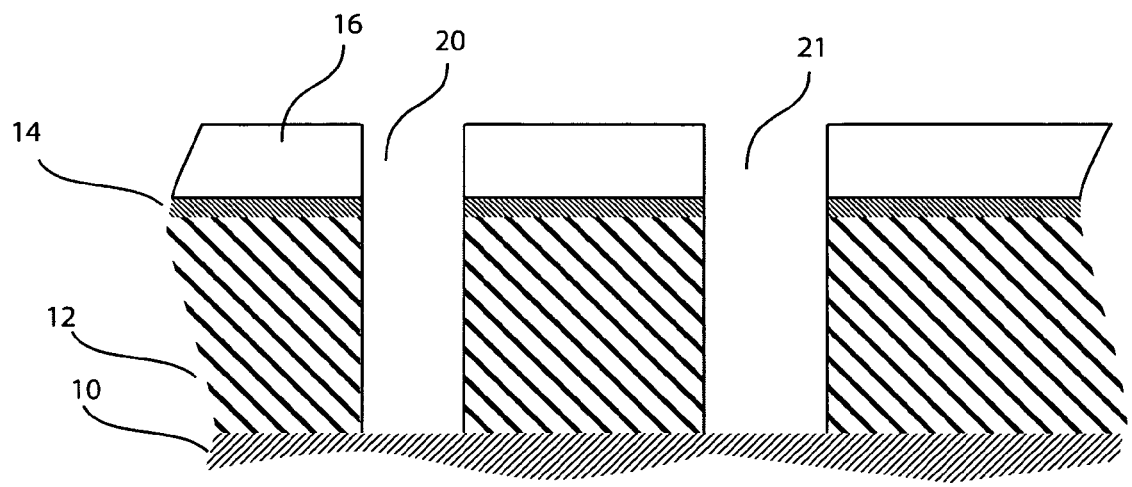
FIG. 2 is a cross-sectional view showing the layer stack of FIG. 1 patterned to form holes.

Referring to FIG. 2, print and etch holes 20, 21 at desired locations, by employing photoresist 16 and conventional lithographic and etching techniques. Etching penetrates hardmask 14 and material 12, stopping on underlying layer 10. Hole 21 is shown wider than hole 20 to illustrate improved tolerances as will be described later.

Figure 3:
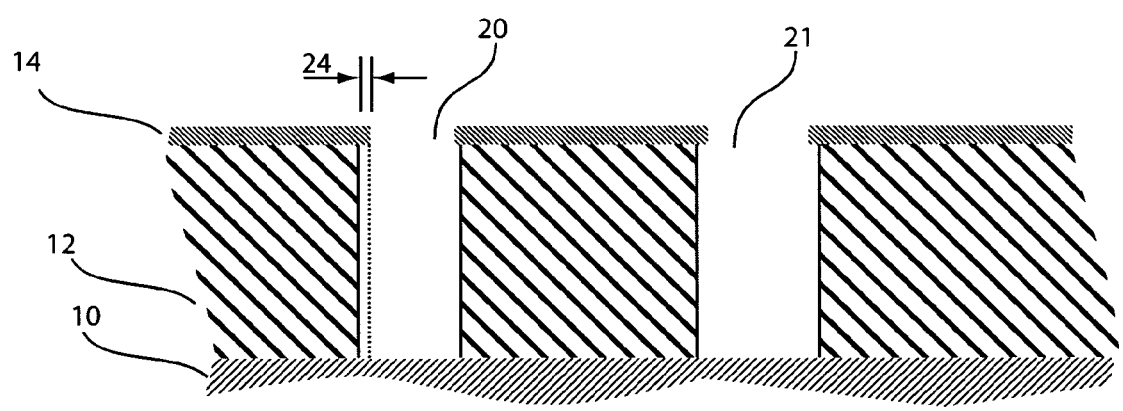
FIG. 3 is a cross-sectional view showing the first layer of FIG. 2 etched to form an overhang using the hardmask.

Referring to FIG. 3, resist 16 is stripped. Then, material 12 (e.g., silicon dioxide) is laterally-etched undercutting un-etched portions of hardmask 14, using a very-well controlled method (such as COR for oxide, although other etches may be employed, e.g., an oxidation/strip may be employed if material 12 is polysilicon, etc.). In one embodiment, etch amount 24 is about one half of a desired final hole dimension. Etch amount may be, e.g., 15-25 nm, depending on final target size. Note that the etch process selected should be selective to underlying material 10 and to hardmask 14. The etching tolerance may be controlled to be between about 1% and 5%. The portions etched back in material 12 cause hardmask 14 to overhang.

Figure 4:
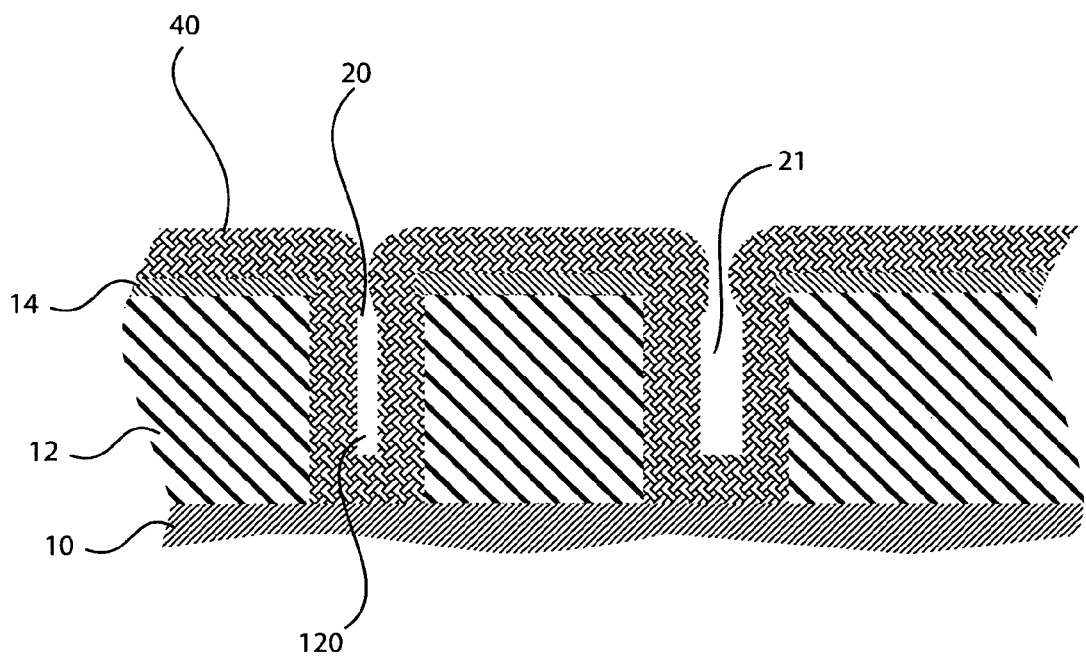
FIG. 4 is a cross-sectional view showing a conformal layer deposited on the structure of FIG. 3 to reduce the hole size.

Referring to FIG. 4, a conformal material 40 is deposited to fill holes 20 and 21. Conformal material 40 can be, for example, amorphous polysilicon, or silicon nitride (same as hardmask 14), or the same as material 12 (e.g., $SiO_2$). FIG. 4 shows a fill "stopped" just as the top of smaller hole 20 fills, leaving seam 120; sealing of the top prevents further filling of hole 20. Filling with material 40 may continue until the top of larger hole 21 also seals/fills with additional thickness of conformal material 40 as shown in FIG. 5.

Figure 5:
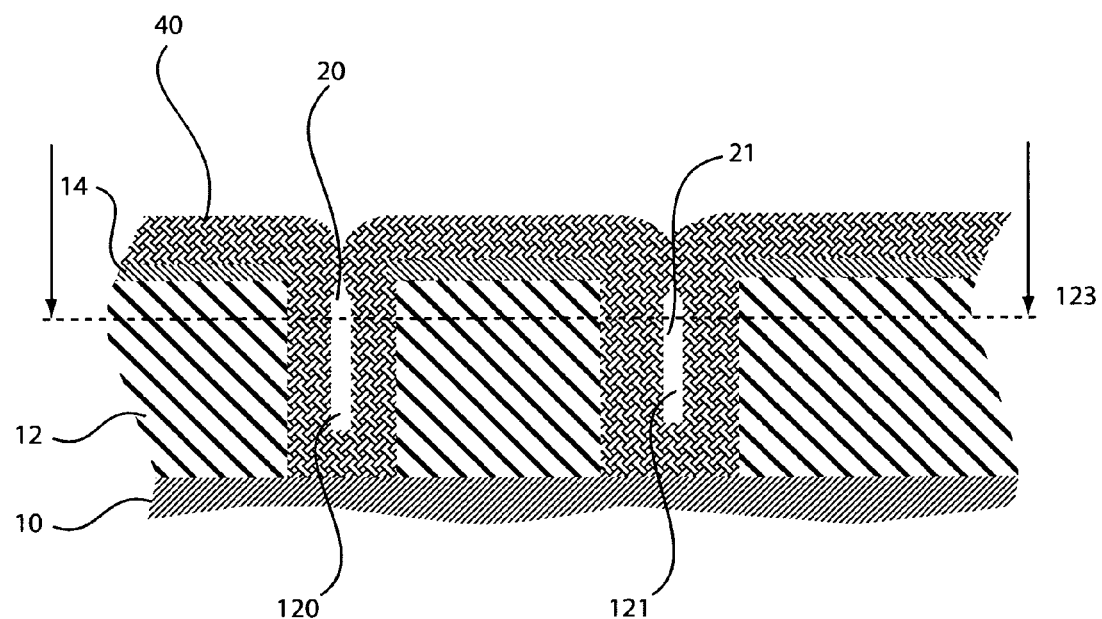
FIG. 5 is a cross-sectional view showing the conformal layer of FIG. 4 expanded to close a largest hole and indicates a position to which etch-back is performed to open up voids/seams in the holes.

Referring to FIG. 5, for both holes 20, 21 the width of the seams 120, 121 is identical, and equal to twice the amount of undercut etch 24. If holes 20, 21 are troughs, then they should individually be of uniform width or the slots will fill from their widest portion, narrowing the resultant slot until the complete top is sealed.

Referring to FIG. 5, seams 120 and 121 are now transferred to underlying layer 10. Portions of material 40, and optionally hardmask 14 and/or portions of material 12 are to be removed down to a position 123. One method would be to chemical-mechanical polish (CMP) material 40 to stop on hardmask 14 or on material 12 (attractive if material 40 is an easily-polished material such as amorphous silicon).

Figure 6:
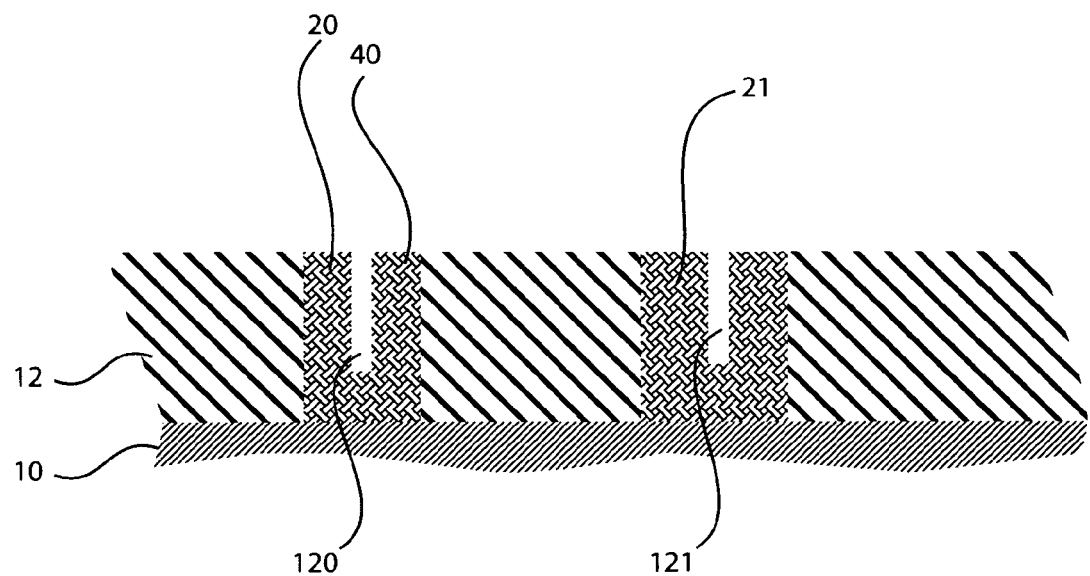
FIG. 6 is a cross-sectional view showing a top surface portion removed to expose the voids/seams in the holes.

Referring to FIG. 6, after CMP or other planarizing technique, the structure shown in FIG. 6 is etched. The etching process may include reactive ion etching (RIE) or anisotropic etching which may be preformed to thin material 40 to reach underlying layer 10 or to etch holes into underlying layer 10, and to provide an appropriate dimension (e.g., sub-lithographic width) for a contact hole(s). To minimize the amount of RIE, the original dimension of holes 20 and 21 should be as small as possible, so that material 40 seals the top of holes 20 and 21 after as little deposition of material 40 as possible.

Figure 7:
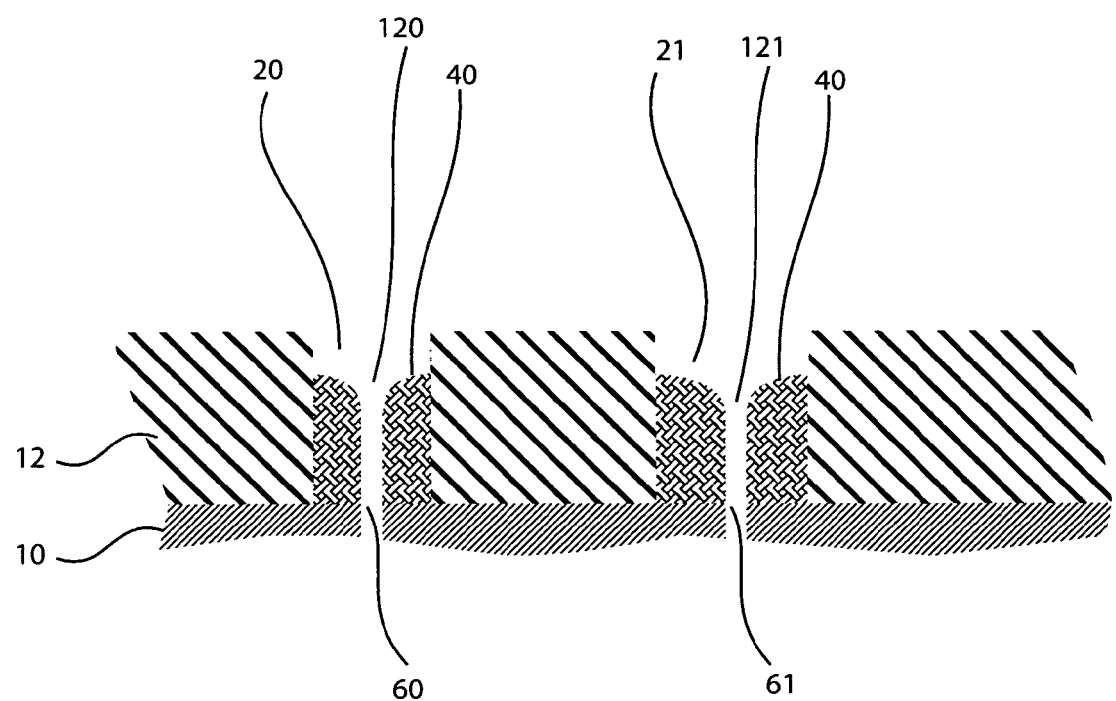
FIG. 7 is a cross-sectional view showing the voids/seams extended to the underlayer and in the case shown, holes formed in the underlayer using the conformal layer as a mask.

Referring to FIG. 7, the intersections between seam 120 and layer 10, and between seam 121 and layer 10, are of identical width even though the original contact holes 20 and 21 where of different sizes originally (e.g., due to tolerances). Seams 120, 121 are now employed to mask directional etch of underlying layer 10, creating holes 60 and 61, having the same diameter, from original holes 20 and 21 having unequal starting diameters.

Figure 8:
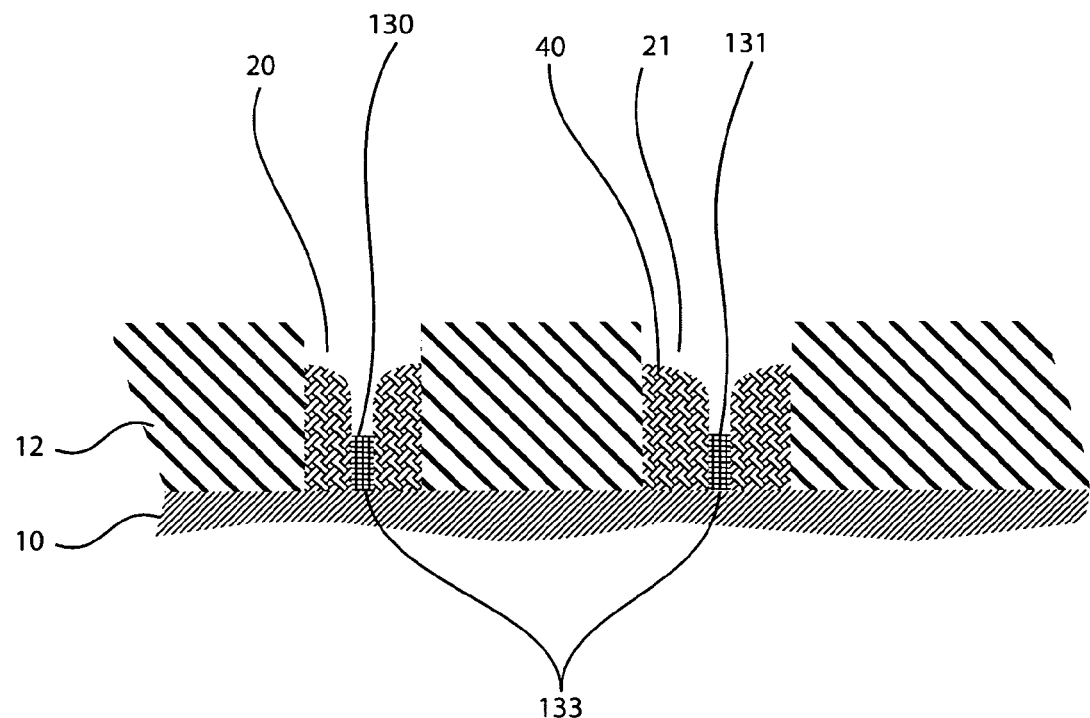
FIG. 8 is a cross-sectional view showing a plug formed within the voids/seams between the conformal layer, the plug may be uses as is or employed as a mask to form pillars in the underlayer.

Referring to FIG. 8, if precisely-controlled studs 130 and 131 are needed rather than holes/vias, various "image reversal" techniques can be applied. After RIE and/or CMP to remove the overhangs and expose the straight portions of seams 120 and 121 (above), a plug material 133 is deposited to fill the seams, then damascene techniques may be employed to pull plug material 133 down into straight portions of seams 120/121, as indicated.

Resulting plugs 130, 131, if plug material 133 is the desired final material, can be employed as is, or, after removal of materials 12 and 40, plugs 130, 131 can be utilized as hardmasks to pattern (RIE) underlying material 10 into precision studs/pillars.

Figure 9:
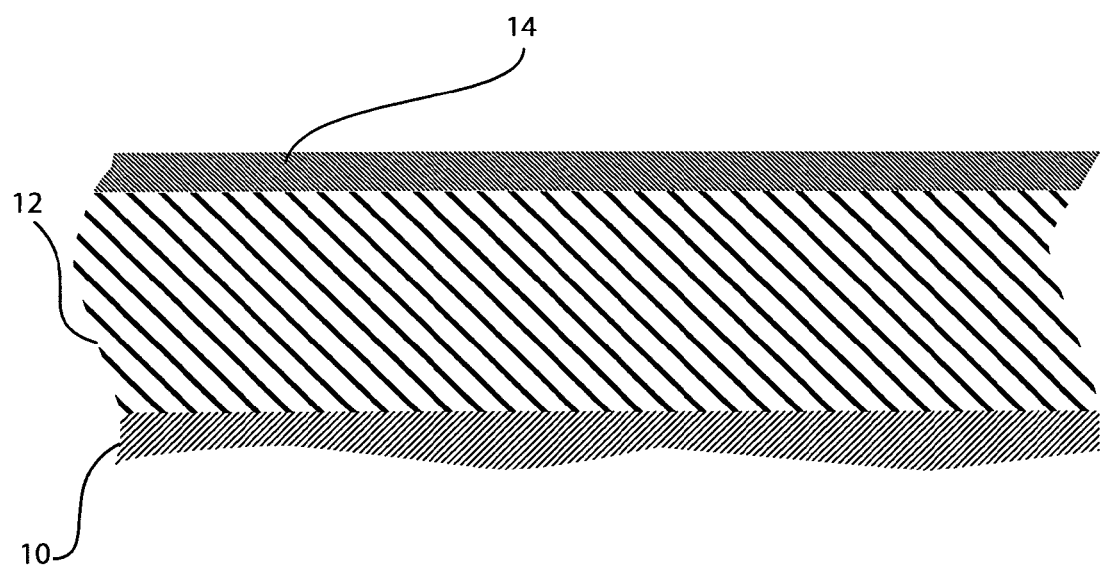
FIG. 9 is a cross-sectional view of a layer stack including an underlayer, a first layer of material on the underlayer and a hardmask in accordance with another embodiment.

Referring to FIG. 9, in another embodiment, a selective deposition on the sidewalls of an upper layer may be employed to create a precisely-controlled overhang. An accurately-dimensioned narrow-dimension contact hole may be formed in accordance with this embodiment through underlying layer 10 which can be, for example, a low-K interlevel dielectric or a substrate as described above.

A layer of material 12 ($Si_3N_4$, for example) is deposited. Material 12 will form part of a hard-mask structure. A thickness of 200-400 nm may be employed. Cap material 12 with 20-100 nm of a top material 14, such as, e.g., $SiO_2$. Top material 14 should be chosen so that it can serve as a sub-layer onto which a selective deposition of selective material 30 (FIG. 11) can be formed.

Figure 10:
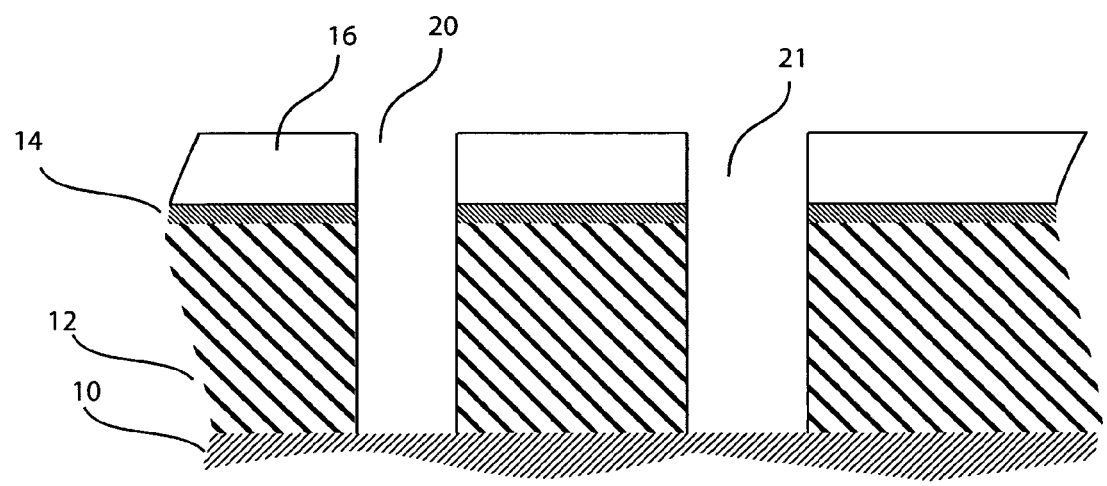
FIG. 10 is a cross-sectional view showing the layer stack of FIG. 9 patterned to form holes.

Referring to FIG. 10, print and etch holes 20, 21 at desired locations, employing photoresist 16 and conventional lithographic and etching techniques. Etching preferably penetrates top material 14 and material 12, stopping on underlying layer 10. Hole 21 is drawn wider than hole 20 to illustrate improvement of tolerances afforded in accordance with the present invention.

Figure 11:
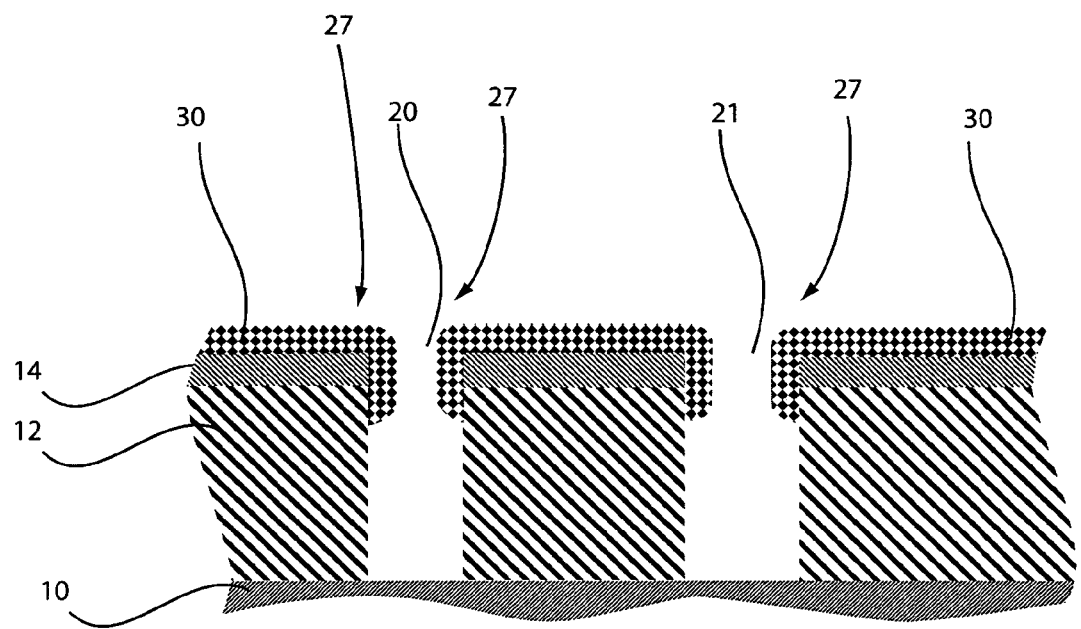
FIG. 11 is a cross-sectional view showing a selectively deposited layer to form an overhang by selective deposition on the hardmask.

Referring to FIG. 11, resist 16 is stripped. A selective material 30 is selectively deposited onto top material 14 to create an overhang 27. This selective deposition is chosen so that the thickness of material is insensitive to loading and topography issues. Selective liquid-phase oxide deposition is one preferred material for selective deposition. A final hole dimension in underlying layer 10 will be twice the overhang dimension; for example, a layer of material 30 having a thickness of 45 nm would form a 90 nm contact hole.

Figure 12:
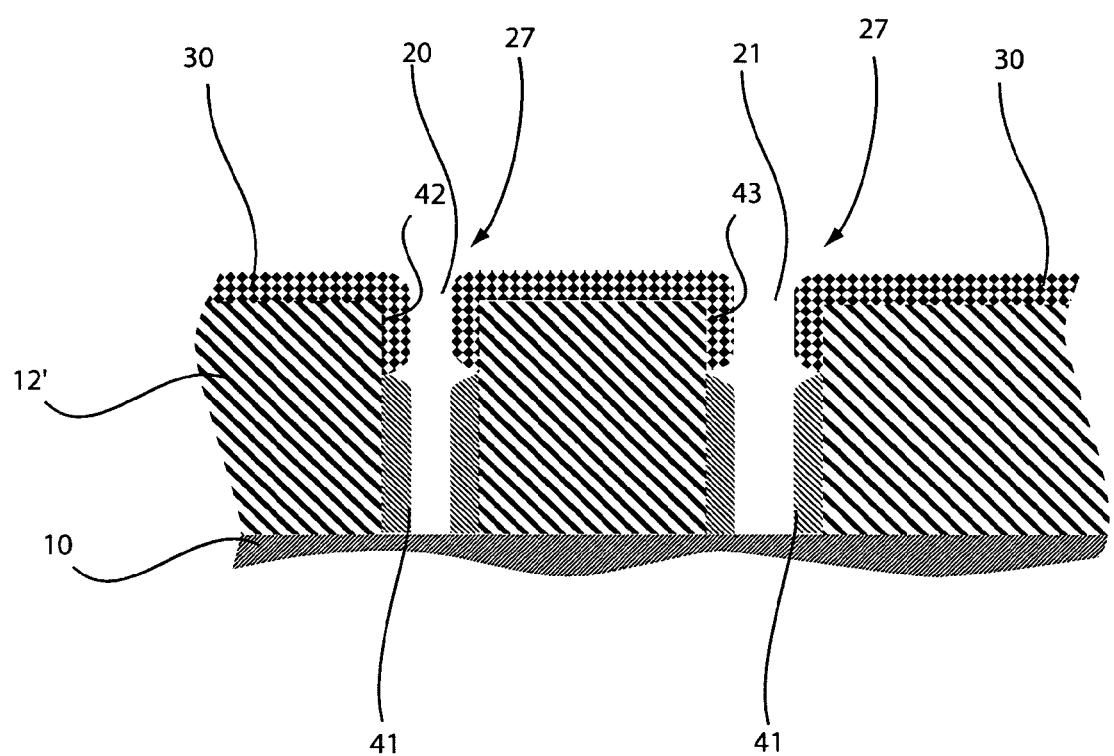
FIG. 12 is a cross-sectional view showing an alternate embodiment where spacers are formed in the holes and a selectively deposited layer is formed over sides of the holes and a top surface to for an overhang.

An alternative method for establishing conditions in which a selective material 30 can be deposited to form an overhang 27 is shown in FIG. 12.

Referring to FIG. 12, a two-material stack (material 12 and top material 14) can be replaced with a single material 12' (which may include a silicon dioxide), onto which selective material 30 deposits selectively, and spacers 41 (e.g., a silicon nitride) formed and pulled down to expose portions 42/43 of sidewalls of holes 20 and 21. Alternately, later 12' may be formed initially with a hardmask (14) and the hardmask is removed prior to depositing the selective material 30.

Material 30 is selectively deposited on material 12'. Other techniques may be employed to form overhangs 27, as well. The spacers 41 may be removed by a selective etching process.

Figure 13:
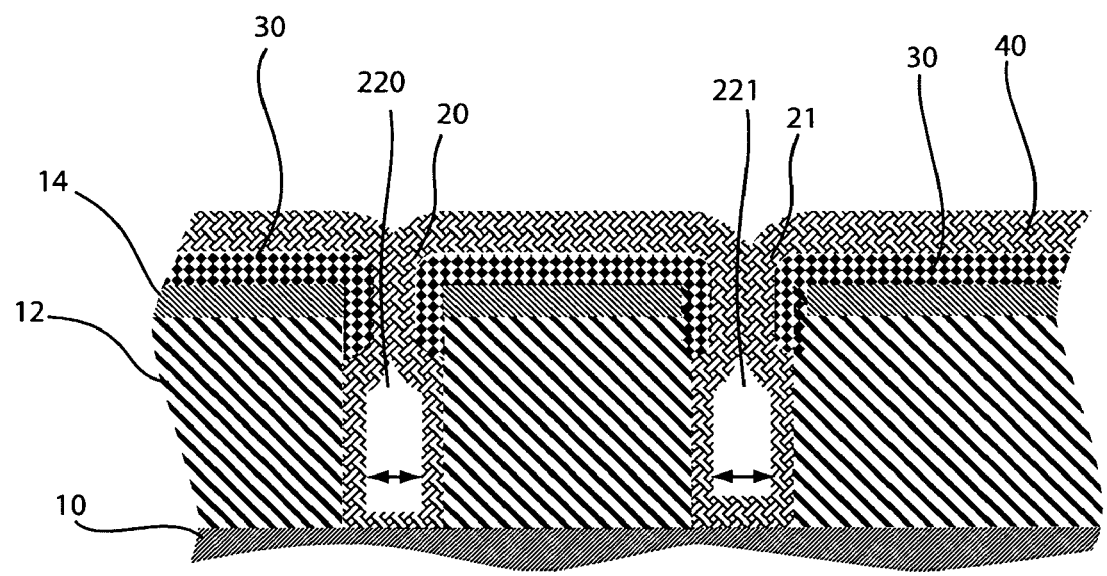
FIG. 13 is a cross-sectional view showing a conformal layer expanding the overhang to close the holes.

Referring to FIG. 13, a non-selective conformal material 40 is deposited, and deposited to a thickness such that a widest hole (shown as hole 21) closes up in the area of overhang 27. Material 40 may include a chemical vapor deposition of polysilicon or nitride, or atomic layer deposition (ALD) of $SiO_2$. Voids 220 and 221 created by this overhang 27 and conformal deposition will advantageously have the same width despite the size difference of holes 20 and 21.

Figure 14:
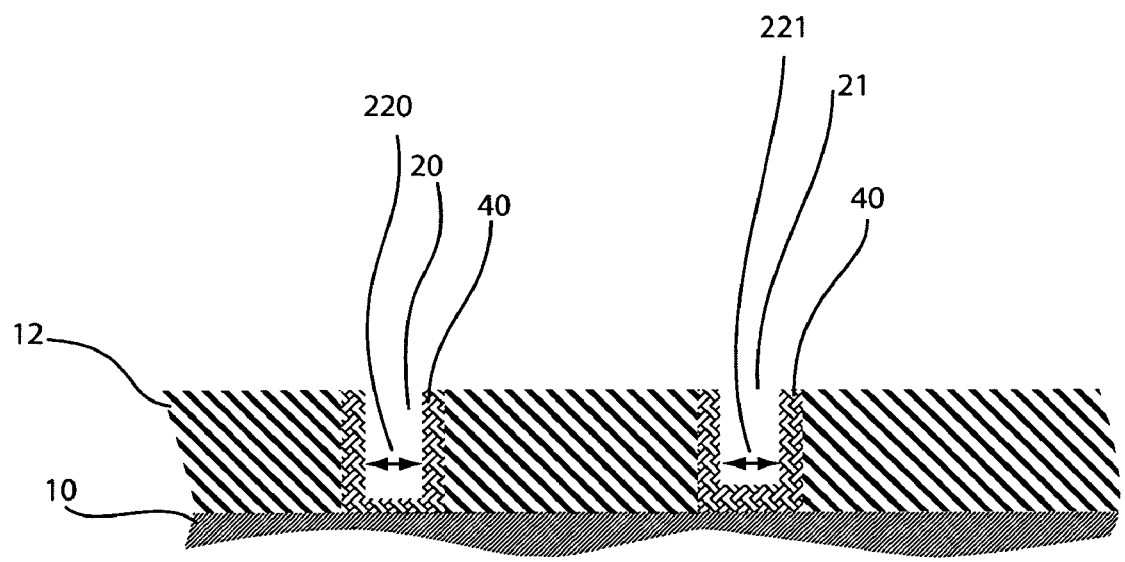
FIG. 14 is a cross-sectional view showing a top surface portion removed to expose the voids/seams in the holes.

Referring to FIG. 14, polishing or otherwise non-selectively removing portions of conformal material 40, selective material 30, top material 14, and material 12 is performed to expose the vertical portions of voids 220 and 221.

Figure 15:
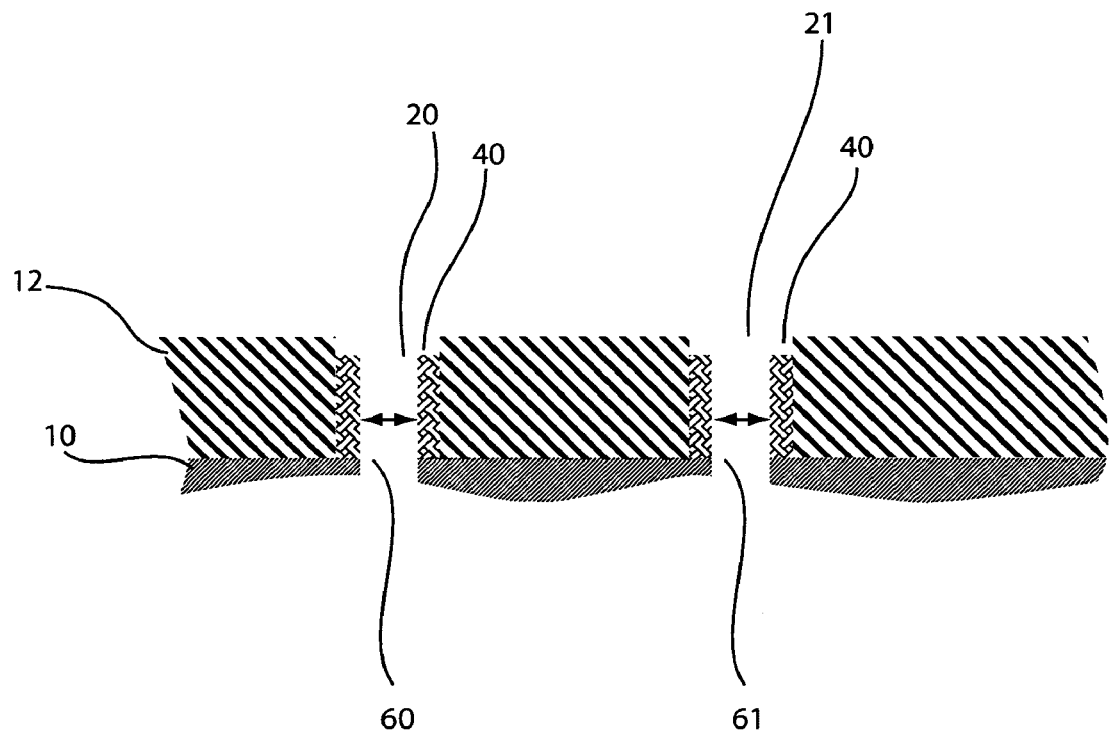
FIG. 15 is a cross-sectional view showing the voids/seams extended to the underlayer and in the case shown, holes formed in the underlayer using the conformal layer as a mask.

Referring to FIG. 15, conformal material 40 is anisotropically etched (e.g., RIE) to expose underlying layer 10 in the bottoms of holes 20 and 21. This may be maintained as is or the combination of material 12 (or material 12') and the remainder of conformal material 40 may then be employed to mask the etch of underlying layer 10, creating holes 60 and 61, having a same diameter from original holes 20 and 21 having unequal starting diameters.

The embodiments described produce precisely-controlled lithographic (minimum feature size) or sub-lithographic width features, e.g., holes, studs, plugs etc. If precise-width studs are the desired final features, then any of several "image reversal" techniques can be applied. For example, after the precision-width cavity is created and exposed via directional etching of the conformal fill material, a dissimilar material can be damascened into the precision hole as set forth with reference to FIG. 8. This material can be either the final material, or a masking material to be used to mask etch of underlying material, after removal of the conformal fill material 40 and the starting base (material 12).

Figure 16:
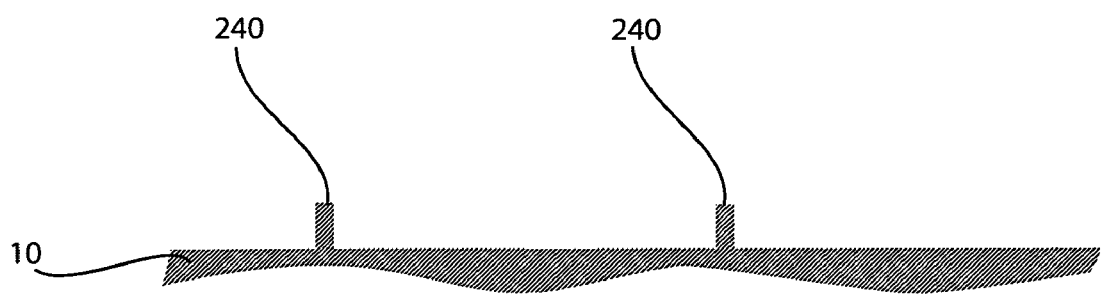
FIG. 16 is a cross-sectional view showing pillars formed in the underlayer.

Referring to FIG. 16 with continues reference to FIG. 8, pillars 240 may be formed in underlayer 10 in one embodiment. Pillars 240 may be formed using, e.g., the plugs 133 (FIG. 8) as a mask. The conformal layer 40 is removed from holes 20 and 21, and underlayer 10 etched to form pillars 240. Pillars 240 are advantageously of the same size despite differences in the size of holes 20 and 21. In this way, pillars 240 are formed having a same size in a reliable way. Pillars 240 preferably include sub-lithographic feature size (e.g., width). Other processing may be employed to form pillars in accordance with each application.

Having described preferred embodiments of methods for forming uniform lithographic features and device having same (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a first layer on an underlying layer;
    forming a hardmask on the first layer;
    patterning holes through the hardmask and first layer;
    forming an overhang extending over sides of the holes;
    depositing a conformal layer over the overhang and in the holes until the conformal layer closes off the holes to form a void/seam in each hole;
    exposing the void/seam in each hole by etching-back a top surface; and
    extending the void/seam in each hole to the underlying layer.

2. The method as recited in claim 1, further comprising etching the underlying layer through the void/seam using the conformal layer within the holes as an etch mask.

3. The method as recited in claim 1, further comprising filling the void/seam with a material to form a plug therein.

4. The method as recited in claim 3, wherein the plug is conductive and employing the plug as a stud or contact.

5. The method as recited in claim 3, wherein the plug is employed as an etch mask, and etching the underlying layer in accordance with the plug to form a pillar in the underlying layer.

6. The method as recited in claim 1, wherein forming an overhang extending over sides of the holes includes etching the first layer to expand the holes and form the overhang of the hardmask layer.

7. The method as recited in claim 1, wherein forming an overhang extending over sides of the holes includes selectively depositing a material to form the overhang.

8. The method as recited in claim 1, wherein the material is deposited selectively with respect to the hardmask.

9. The method as recited in claim 1, wherein the holes include different widths but depositing the conformal layer forms voids/seams in each hole having a same width.

10. The method as recited in claim 1, wherein the depositing the conformal layer includes depositing the conformal layer until a top of each hole has been closed.

11. A method for fabricating a semiconductor device having uniform sized sub-lithographic features, comprising:
    forming a first layer on an underlying layer;
    forming a hardmask on the first layer;
    patterning holes having different sizes due to tolerances through the hardmask and first layer;
    forming an overhang extending over sides of the holes by etching the first layer to expand the holes in the first layer such that the hardmask layer forms the overhang over the holes;
    depositing a conformal layer over the overhang and in the holes until the conformal layer closes off a top of the holes to form a void/seam in each hole having a sub-lithographic dimension;
    exposing the void/seam in each hole by etching back a top surface; and
    extending the void/seam in each hole to the underlying layer to provide a sub-lithographic sized hole.

12. The method as recited in claim 11, further comprising etching the underlying layer through the void/seam using the conformal layer within the holes as an etch mask.

13. The method as recited in claim 11, further comprising filling the void/seam with a material to form a plug therein.

14. The method as recited in claim 11, wherein the holes include different widths but depositing the conformal layer forms voids/seams in each hole having a same width.

15. The method as recited in claim 11, wherein the depositing the conformal layer includes depositing the conformal layer until a top of each hole has been closed.

16. A method for fabricating a semiconductor device having uniform sized sub-lithographic features, comprising:
    forming a first layer on an underlying layer;
    forming a hardmask on the first layer;
    patterning holes through the hardmask and first layer;
    forming an overhang extending over sides of the holes by selectively depositing a material to form the overhang;
    depositing a conformal layer over the overhang and in the holes until the conformal layer closes off the holes to form a void/seam in each hole;
    exposing the void/seam in each hole by etching back a top surface; and
    extending the void/seam in each hole to the underlying layer.

17. The method as recited in claim 16, further comprising etching the underlying layer through the void/seam using the conformal layer within the holes as an etch mask.

18. The method as recited in claim 16, wherein the holes include different widths but depositing the conformal layer forms voids/seams in each hole having a same width.

19. The method as recited in claim 16, wherein the depositing the conformal layer includes depositing the conformal layer until a top of each hole has been closed.

20. A method for fabricating a semiconductor device having uniform sized sub-lithographic features, comprising:
    forming a first layer on an underlying layer;
    patterning holes through the first layer;
    forming spacers on sides of the holes;
    selectively depositing a material on the first layer other than on the spacers to form an overhang over the holes using the selectively deposited material;
    removing the spacers;
    depositing a conformal layer over the overhang and in the holes until the conformal layer closes off a top of the holes to form a void/seam in each hole;
    exposing the void/seam in each hole by etching back a top surface; and
    extending the void/seam in each hole to the underlying layer.

* * * * *